United States Patent
Cho et al.

(10) Patent No.: US 11,050,024 B2
(45) Date of Patent: Jun. 29, 2021

(54) METHOD OF MANUFACTURING SURFACE-MODIFIED POLYMER FILM AND METHOD OF FABRICATING ORGANIC ELECTRONIC DEVICE COMPRISING THE SAME

(71) Applicants: CENTER FOR ADVANCED SOFT ELECTRONICS, Pohang-si (KR); POSTECH ACADEMY-INDUSTRY FOUNDATION, Pohang-si (KR)

(72) Inventors: Kilwon Cho, Pohang-si (KR); Jinsung Kim, Busan (KR); Boseok Kang, Pohang-si (KR)

(73) Assignees: CENTER FOR ADVANCED SOFT ELECTRONICS, Pohang-si (KR); POSTECH ACADEMY—INDUSTRY FOUNDATION, Pohang-si (KR)

( * ) Notice: Subject to any disclaimer, the term of this patent is extended or adjusted under 35 U.S.C. 154(b) by 109 days.

(21) Appl. No.: 16/168,885

(22) Filed: Oct. 24, 2018

(65) Prior Publication Data

US 2019/0181343 A1    Jun. 13, 2019

(30) Foreign Application Priority Data

Dec. 12, 2017   (KR) .......................... 10-2017-0170331

(51) Int. Cl.
*H01L 51/00* (2006.01)
*H01L 51/05* (2006.01)
(Continued)

(52) U.S. Cl.
CPC .......... *H01L 51/0003* (2013.01); *B05D 1/185* (2013.01); *C08J 7/123* (2013.01);
(Continued)

(58) Field of Classification Search
CPC .......................... H01L 51/0003; B05D 1/185
See application file for complete search history.

(56) References Cited

U.S. PATENT DOCUMENTS

| 6,423,465 B1 * | 7/2002 | Hawker | ................ G03F 7/0392 |
| | | | 430/203 |
| 2009/0297868 A1 * | 12/2009 | Ito | ....................... H01L 51/0533 |
| | | | 428/447 |

FOREIGN PATENT DOCUMENTS

| JP | 2008170515 A | 7/2008 |
| KR | 1020140099409 A | 8/2014 |
| KR | 1020170059199 A | 5/2017 |

OTHER PUBLICATIONS

Tsuda et al. "Effect of Photoacid Generator on Surface Wettability Controllable Polyimides by UV Light Irradiation" (2015) (Year: 2015).*

(Continued)

*Primary Examiner* — Nathan T Leong
(74) *Attorney, Agent, or Firm* — STIP Law Group, LLC

(57) ABSTRACT

Disclosed is a method of manufacturing a surface-modified polymer film, including forming a hydroxyl group (—OH) on the surface of a polymer film by subjecting the polymer film to light irradiation and surface treatment with a photoacid generator. The polymer film can be introduced with a hydroxyl group (—OH) group using a photoacid generator, thereby modifying the surface of the polymer film without damage to the polymer film. Also, an organic electronic device including the surface-modified polymer film can be improved in electrical characteristics and stability.

15 Claims, 10 Drawing Sheets

(51) Int. Cl.
*B05D 1/18* (2006.01)
*C08J 7/14* (2006.01)
*C08J 7/12* (2006.01)
*H01L 51/42* (2006.01)
*H01L 51/50* (2006.01)

(52) U.S. Cl.
CPC ............ *C08J 7/14* (2013.01); *H01L 51/0036* (2013.01); *H01L 51/0097* (2013.01); *H01L 51/052* (2013.01); *H01L 51/0512* (2013.01); *C08J 2311/00* (2013.01); *H01L 51/42* (2013.01); *H01L 51/50* (2013.01)

(56) References Cited

OTHER PUBLICATIONS

Do Hwan Kim et al.; Single-Crystal Polythiophene Microwires Grown by Self-Assembly; Wiley Inter Science; 2006, pp. 719-723, vol. 18; Wiley-VCH Verlag Gmbh& Co; Weinheim, Germany.

Nolan Tilman et al.; Incorporation of Phenoxy Groups in Self-Assembled Monolayers of Trichlorosilane Derivatives;Effects on Film Thickness, Wettability, and Molecular Orientation; J. Am. Chem Soc; 1988, pp. 6136-6144, vol. 110, No. 18 ; American Chemical Society; Washington DC, USA.

K. P. Pernstich et al.; Threshold voltage shift in organic field effect transistors by dipole monolayers on the gate insulator; Journal of Applied Physics; Dec. 1, 2004, vol. 96, No. 11; American Institute of Physics; College Park, USA.

David L. Angst, Gary W. Simmons; Moisture Absorption Characteristics of Organosiloxane Self-Assembled Monolayers; Langmuir; 1991, pp. 2236-2242, vol. 7; American Chemical Society; Washington DC, USA.

Mark E. McGovern et al.; Role of Solvent on the Silanization of Glass with Octadecyltrichlorosilane; Langmuir; 1994, pp. 3607-3614, vol. 10 ; American Chemical Society; Washington DC, USA.

Office action from Korean Intellectual Property Office of 10-2017-0170331, dated Dec. 17, 2018.

The extended European Search report of 18 20 3481, dated Apr. 25, 2019.

* cited by examiner

[FIG. 1]
[FIG. 2]
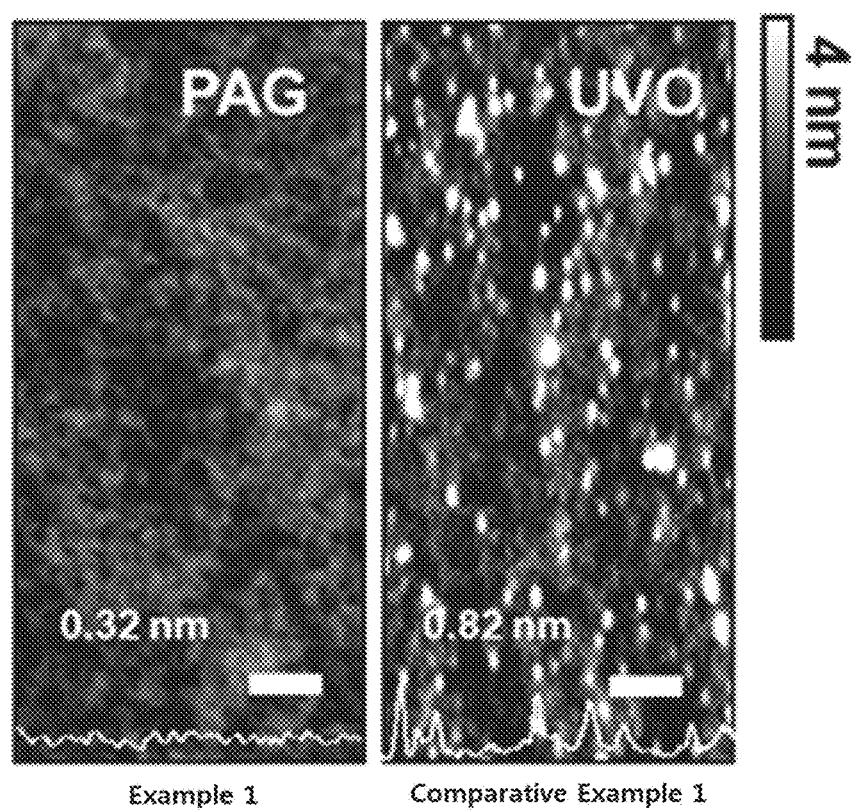
[FIG. 3]

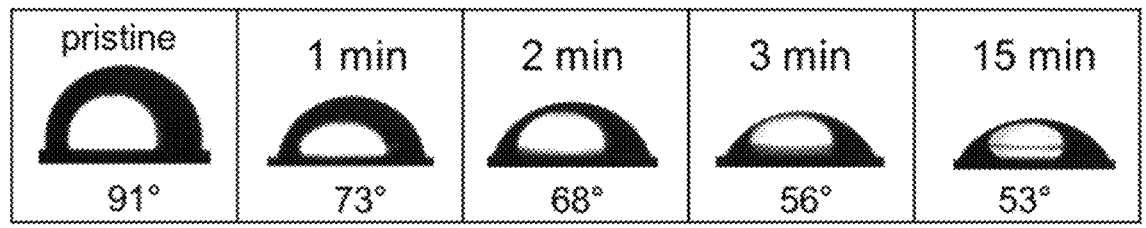
[FIG. 4]
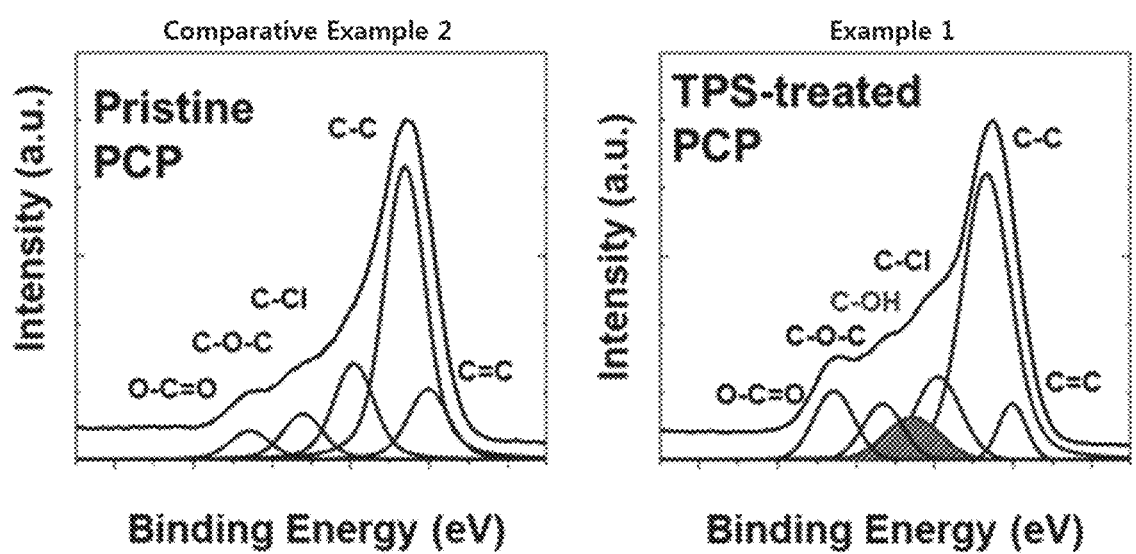
[FIG. 5]

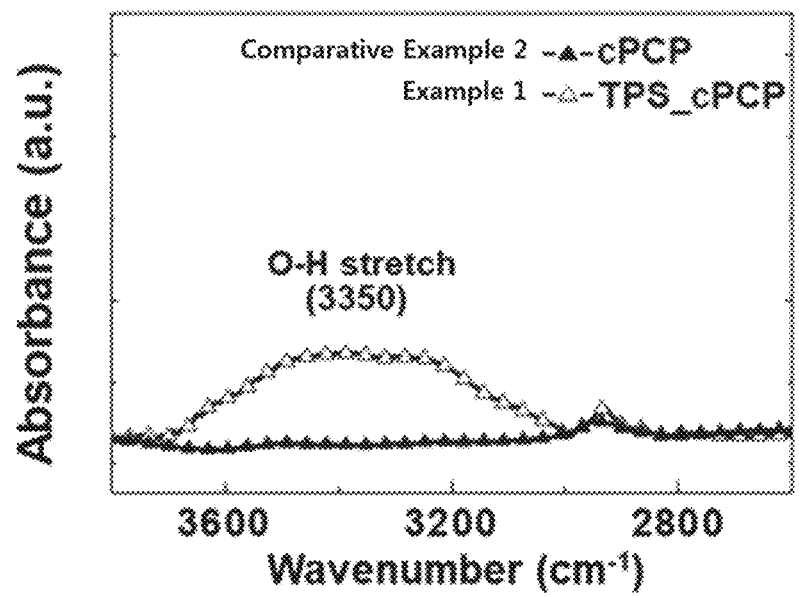
[FIG. 6]
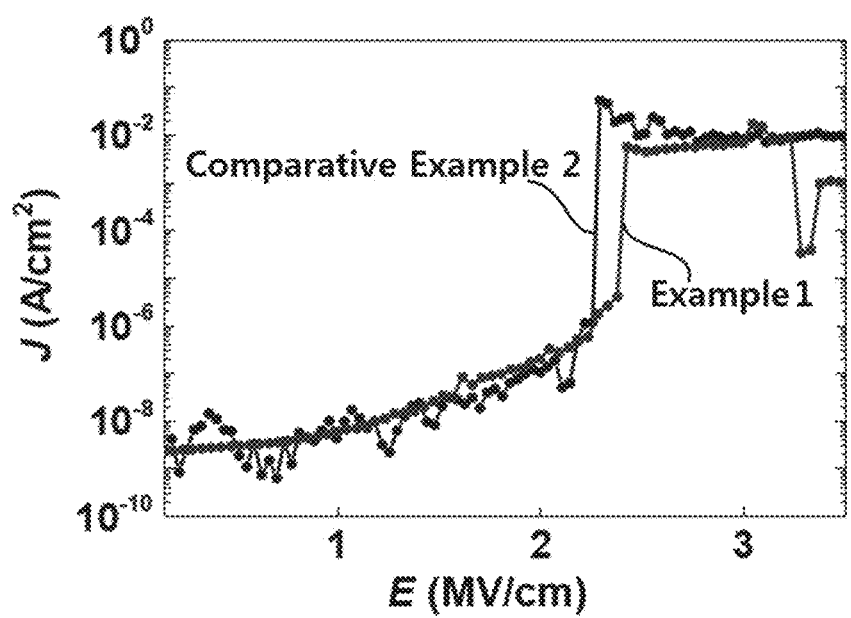
[FIG. 7]

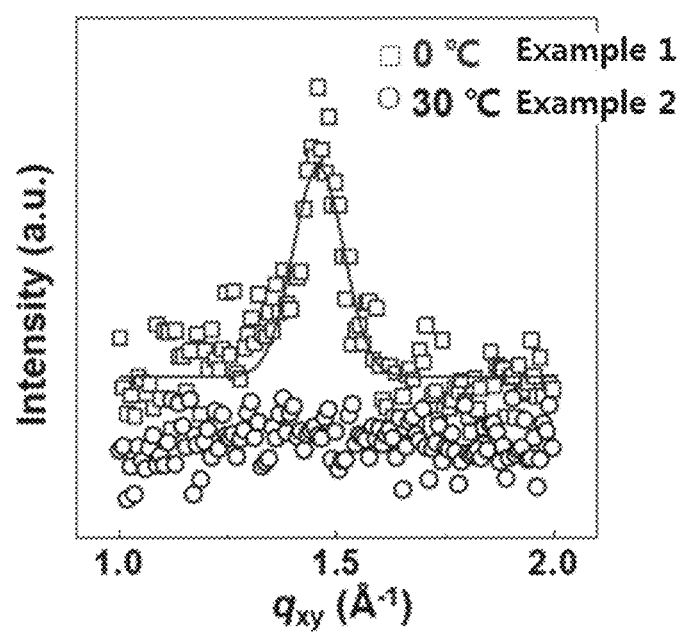
[FIG. 8A]
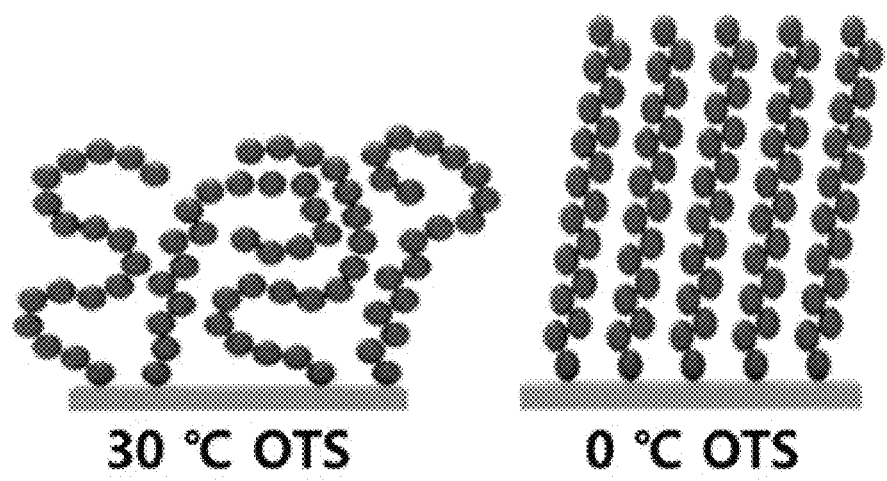
[FIG. 8B]

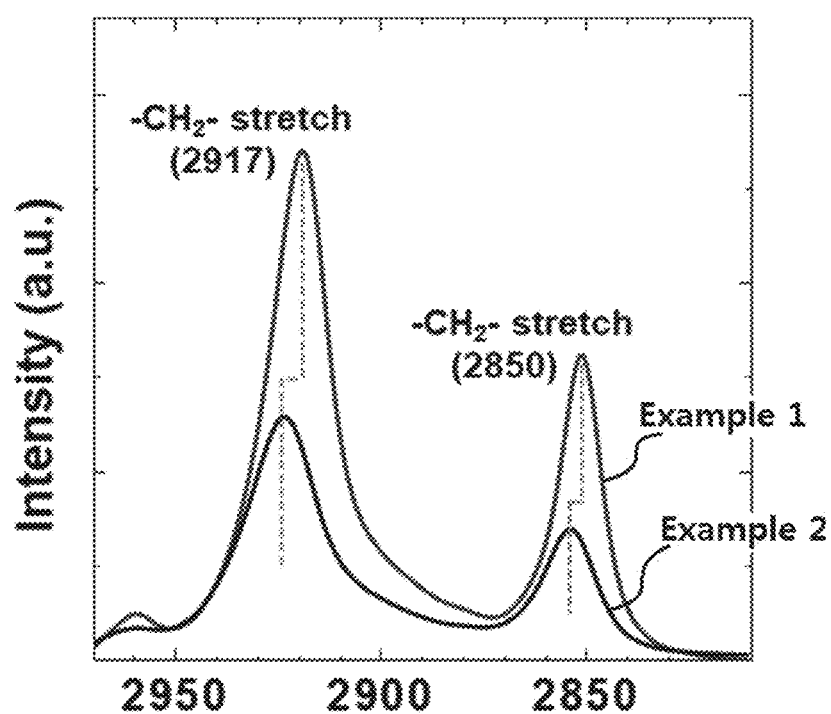
[FIG. 8C]

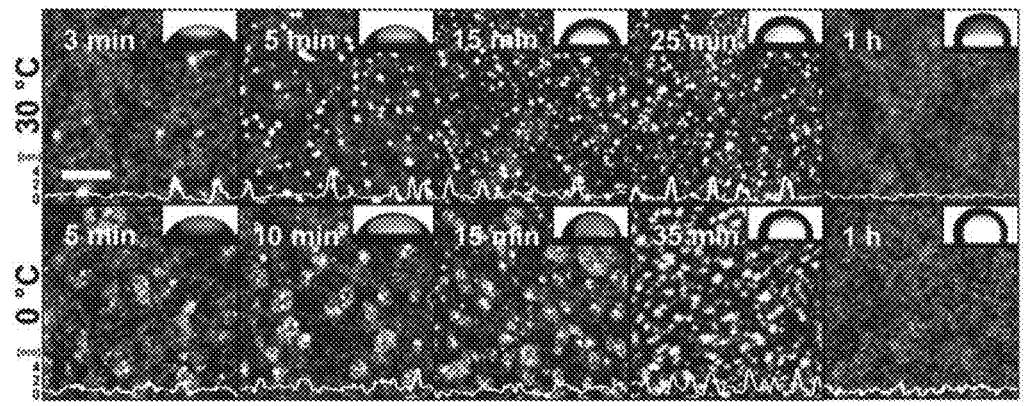
[FIG. 9A]
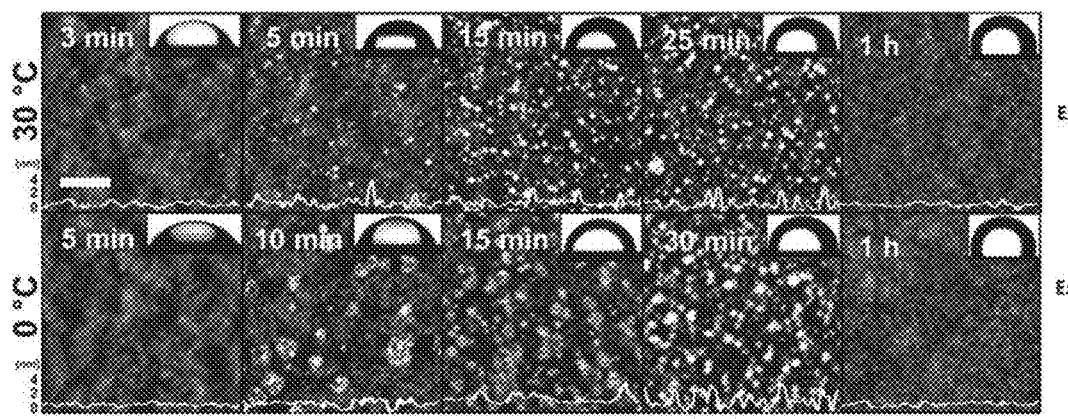
[FIG. 9B]

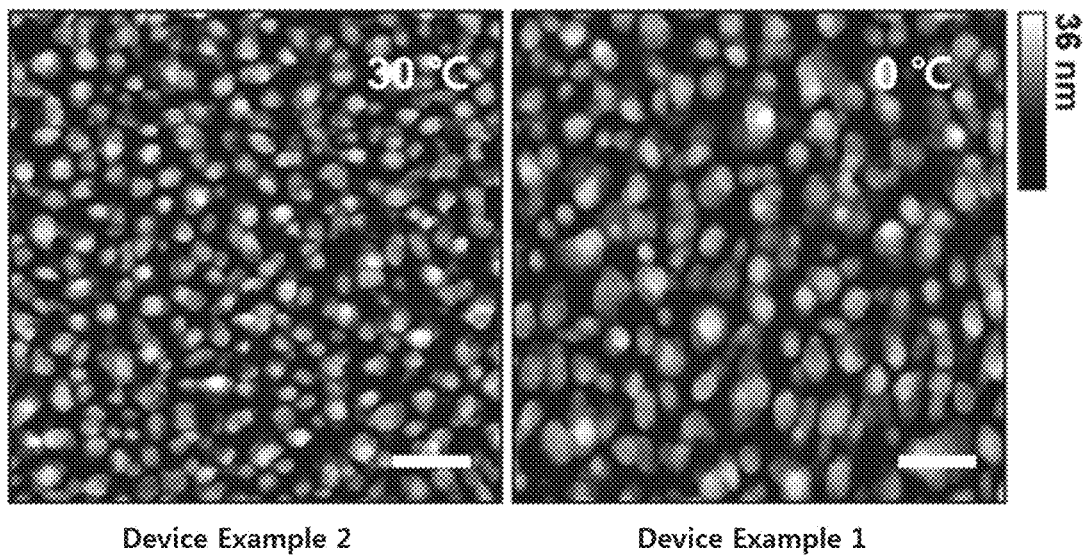
[FIG. 10A]
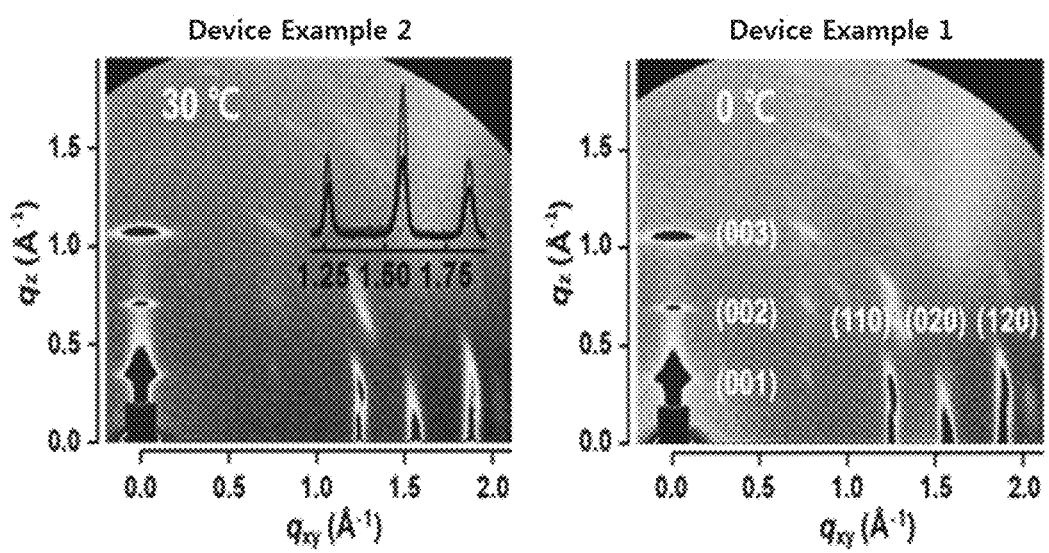
[FIG. 10B]

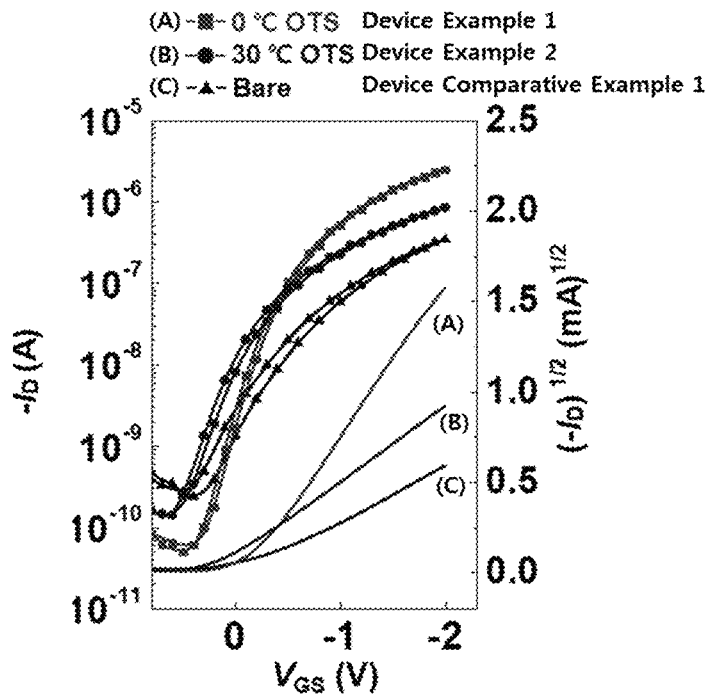
[FIG. 11A]
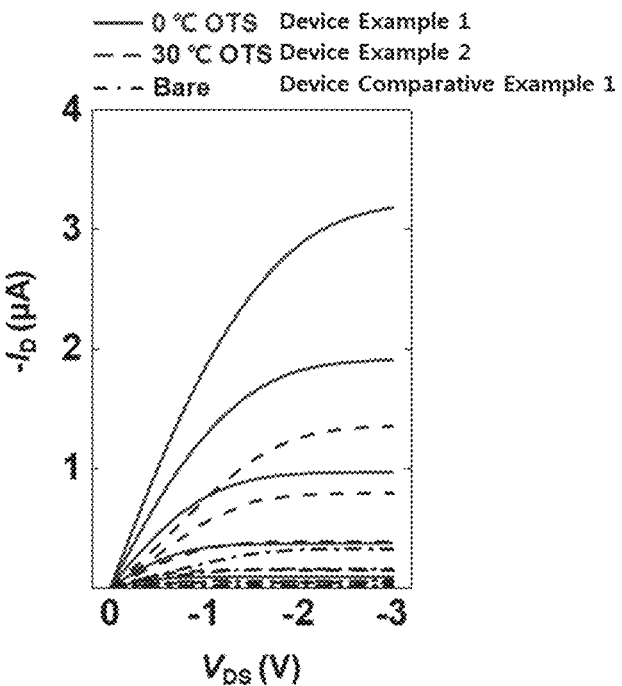
[FIG. 11B]

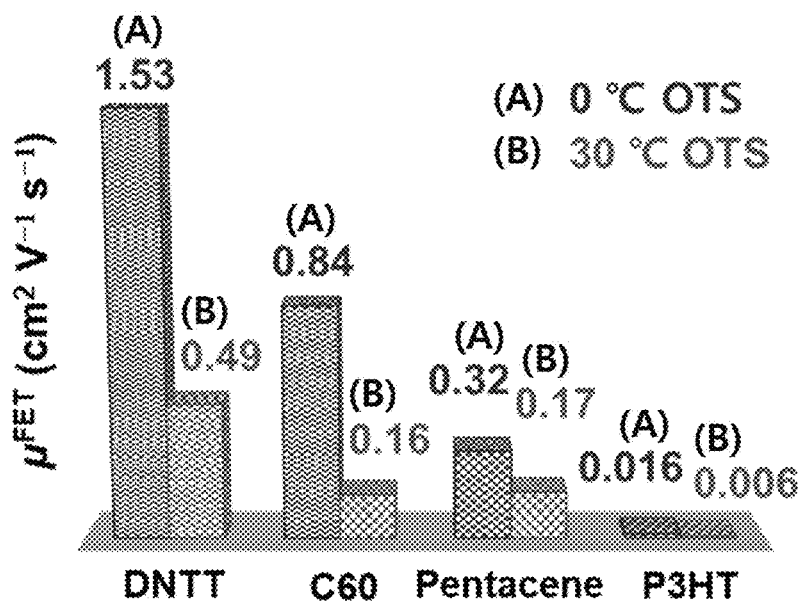
[FIG. 12]
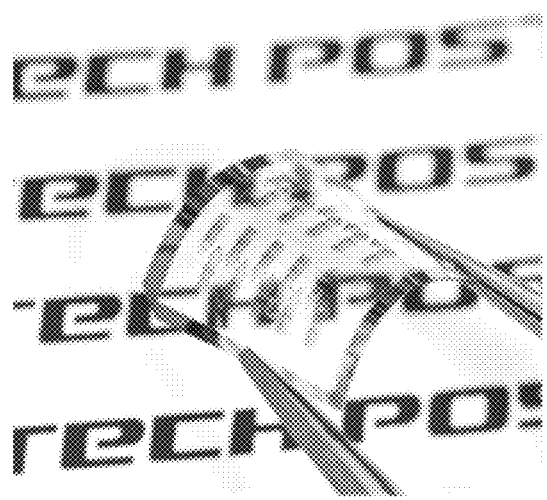
[FIG. 13A]

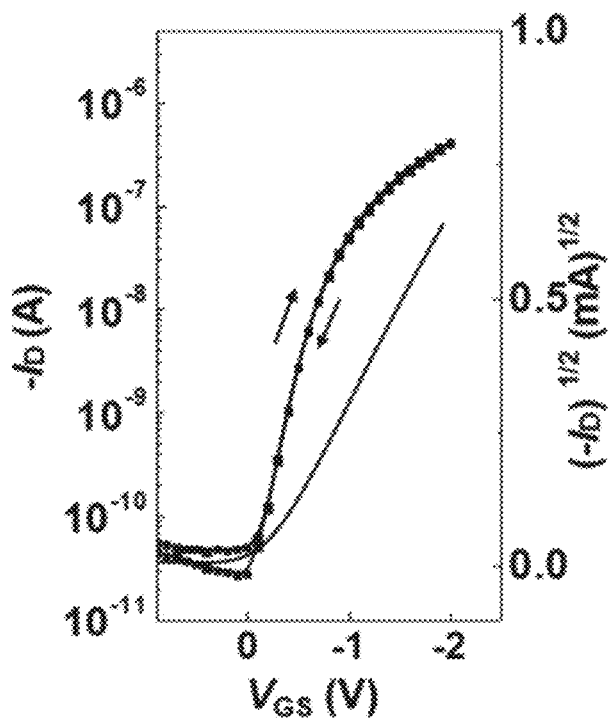
[FIG. 13B]
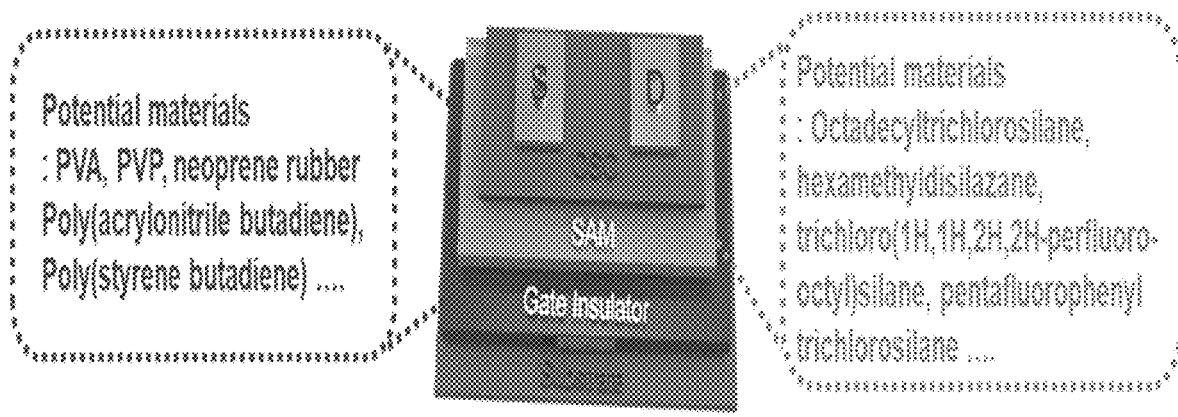
[FIG. 14]

METHOD OF MANUFACTURING SURFACE-MODIFIED POLYMER FILM AND METHOD OF FABRICATING ORGANIC ELECTRONIC DEVICE COMPRISING THE SAME

CROSS-REFERENCE TO RELATED APPLICATION

This application claims the priority of the Korean Patent Applications NO 10-2017-0170331 filed on Dec. 12, 2017 in the Korean Intellectual Property Office, the disclosure of which is incorporated herein by reference.

BACKGROUND OF THE INVENTION

1. Technical Field

The present invention relates to a method of manufacturing a surface-modified polymer film and a method of fabricating an organic electronic device including the same. More particularly, the present invention relates to a method of manufacturing a surface-modified polymer film, in which the polymer film is introduced with a hydroxyl group (—OH) using a photoacid generator, thereby modifying the surface of the polymer film without damage to the polymer film, and to a method of fabricating an organic electronic device including the same.

2. Description of the Related Art

Typically, an insulating film for an organic thin-film transistor is formed of an inorganic material such as silicon dioxide ($SiO_2$), etc. or an organic material such as polyvinyl alcohol (PVA), polyvinyl phenol (PVP), polymethyl methacrylate (PMMA), polyimide (PI), etc. An insulator is able to form an interface with an organic semiconductor, and thus the crystallinity, shape, etc. of the organic semiconductor may vary depending on the interfacial properties of the insulator, which is regarded as key in the device characteristics of the final organic thin-film transistor. A gate insulating film using a flexible/elastic polymer having polarity is essential for the fabrication of a flexible/stretchable organic transistor that is capable of operating at low power. The polymer insulating film having polarity, however, inhibits the growth of the organic semiconductor thin film due to the hydrophilic surface properties thereof, and in order to prevent such inhibition, the polymer insulating film needs additional surface treatment.

Typically, in the case of silicon dioxide (SiO2), which is an inorganic insulating film, many techniques for introducing alkylsilane on the film surface using a self-assembled monolayer (SAM) technique have been reported (Adv. Mater. 2006, 18, 719, J. Appl. Phys. 2004, 965, 6431, Langmuir, 1994, 10, 3607, Langmuir, 1991, 7, 2236, J. Am. Chem. Soc, 1998, 110, 6136).

When alkylsilane is introduced in this way, the surface evenness of the insulating film is improved, and moreover, an alkyl chain is introduced onto the surface thereof, whereby a hydrophilic surface is changed to a hydrophobic surface, thus increasing bondability with the organic semiconductor, such as hydrophobic pentacene, and inducing high crystallinity of the organic semiconductor, ultimately improving transistor characteristics.

In order to apply a self-assembled monolayer, a hydroxyl group (—OH) for covalent bonding with self-assembled monolayer molecules should be present on the surface of a polymer gate insulating film. Conventional techniques for forming a hydroxyl group on the surface of the insulating film may include oxygen plasma, UV-ozone treatment, etc., which are unsuitable for the fabrication of next-generation polymer insulating film-based flexible/stretchable electronic devices. These methods break the molecular connection of a soft polymer insulating film, thus causing fatal defects such as low density and high surface roughness. Thereby, the electrical barrier properties of the insulator layer may decrease, and a rough surface may be formed, which consequently deteriorates device stability, reliability, and overall performance. With the goal of solving such problems, surface treatment may be performed using a strong acid such as sulfuric acid or nitric acid but is disadvantageous because very low safety may result upon actual use thereof and because it is difficult to control the extent of surface treatment.

Accordingly, there is required a method of introducing a hydrophobic material to the surface of a polymer gate insulating film having flexible/elastic properties through chemical bonding without damage to the polymer gate insulating film, thereby modifying surface properties, ultimately improving bondability with the organic semiconductor and transistor characteristics.

SUMMARY OF THE INVENTION

Accordingly, the present invention has been made keeping in mind the problems encountered in the related art, and the present invention is intended to provide a method of manufacturing a surface-modified polymer film, in which the polymer film is introduced with a hydroxyl group (—OH) using a photoacid generator, thus modifying the surface of the polymer film without damage to the polymer film.

In addition, the present invention is intended to provide a method of fabricating an organic electronic device having improved electrical characteristics and stability using the surface-modified polymer film obtained through the above method.

Therefore, an aspect of the present invention provides a method of manufacturing a surface-modified polymer film, comprising: (a) forming a hydroxyl group (—OH) on the surface of a polymer film by subjecting the polymer film to light irradiation and surface treatment with a photoacid generator.

The method of the invention may further comprise (b) forming a self-assembled monolayer (SAM) on the surface of the polymer film having the hydroxyl group, after step (a).

The method of the invention may further comprise (a') subjecting the surface of the polymer film to irradiation with UV light and ozone treatment, before step (a).

The polymer film may be manufactured through any one process of spin coating, dip coating, and spray coating, before step (a).

The polymer film may include at least one selected from among poly(vinyl alcohol), poly(4-vinyl phenol), poly(vinyl chloride), polyisoprene, poly(chloroprene) (PCP), poly (acrylonitrile butadiene), poly(styrene-ethylene-butadiene-styrene), poly(styrene butadiene), polyacrylamide, nylon, poly(vinyl acetate), poly(cis-butadiene), poly(1-vinyl naphthalate), polyethylene terephthalate, polyethylene, polyurethane, poly(hexamethylene adipamide), poly(methyl methacrylate), poly(styrene), poly(dimethylsiloxane), poly (vinylidene fluoride), poly(tert-butylstyrene) polyimide, benzocyclobutene (BCB), poly(acrylonitrile), poly(methylene oxide), poly(cyclohexyl methacrylate), and CYTOP (Cyclized Transparent Optical Polymer).

The photoacid generator may include at least one selected from among triphenylsulfonium triflate (TPS), (4-tert-butylphenyl) diphenylsulfonium triflate, (4-fluorophenyl) diphenylsulfonium triflate, N-hydroxynaphthalimide triflate (NHN), tris(4-tert-butylphenyl)sulfonium triflate, bis(4-tert-butylphenyl)iodonium perfluoro-1-butanesulfonate, and Boc-methoxyphenyldiphenylsulfonium triflate.

The self-assembled monolayer (SAM) may include at least one selected from among aminopropyltriethoxysilane, hexamethyldisilazane, methyltrichlorosilane, octyltrichlorosilane (OTS), dodecyl trichlorosilane, octadecyltrichlorosilane, trichloro(1H,1H,2H,2H-perfluorooctyl)silane, pentafluorophenyl trichlorosilane, pentafluorophenyl propyltrichlorosilane, 3-aminoisopropyltriethoxysilane, methoxysilane, chloromethyl (dimethyl)metnoxysilane, (3-aminopropyl) trimethoxysilane, dimethyl (3-chloropropyl)methoxysilane, diethoxy(isobutyl)methoxysilane, methoxy(dimethyl)octadecylsilane, octylphosphonic acid, tetradecylphosphonic acid, decylphosphonic acid, octadecylphosphonic acid, 1-dodecanethiol, octanethiol, and caproic acid.

Here, step (b) may be performed at −30 to 60° C.
Here, step (b) may be performed at −20 to 30° C.
Here, step (b) may be performed at −10 to 10° C.

Another aspect of the present invention provides a surface-modified polymer film, manufactured by the above method.

Still another aspect of the present invention provides a method of fabricating an organic electronic device, comprising: forming a gate insulating layer including a polymer film on a substrate; and forming an active layer including an organic semiconductor, a source electrode and a drain electrode on the gate insulating layer, wherein the forming the gate insulating layer including the polymer film comprises: (a) forming a hydroxyl group (—OH) on the surface of the polymer film by subjecting the polymer film to light irradiation and surface treatment with a photoacid generator; and (b) forming a self-assembled monolayer (SAM) on the surface of the polymer film having the hydroxyl group.

The organic electronic device may be any one selected from among an organic thin-film transistor, an organic solar cell, and an organic light-emitting diode.

The organic electronic device may be an organic thin-film transistor.

The substrate may be a flexible substrate.

The flexible substrate may include at least one selected from among polyimide, polyethylene naphthalate, Parylene, and polyethylene terephthalate.

The organic semiconductor may include at least one selected from among poly(3-hexyl)thiophene, poly(9,9-dioctylfluorene-co-bithiophene), poly[2,5-bis(3-tetradecylthiophen-2-yl)thieno[3,2-b]thiophene], polythiophene, diketopyrrolo-pyrrole-dithiophene-thienothiophene, tetracene, pentacene, fullerene, 6,13-bis (triisopropylsilylethynyl)pentacene (TIPS-pentacene), poly[2,5-bis(3-dodecylthiophen-2-yl)thieno[3,2-b]thiophene] (PBTTT), poly [(4,4-bis(2-ethylhexyl)cyclopenta[2,1-b:3,4-b0]dithiophene)-2,6-diyl-alt-[1,2,5]-thiadiazolo[3,4-c]pyridine] (PCDTPT), didodecyl [1]-benzothieno[3,2-b][1]benzothiophene (C12-BTBT), diketopyrrolopyrrole-dithienylthieno[3,2-b]thiophene (DPP-DTT), cyclopentadithiophene-benzothiadiazole (CDT-BTZ), phthalocyanine, rubrene, 2,7-dioctyl[1]benzothieno[3,2-b][1]benzothiophene, and oligotniophene.

According to the present invention, a polymer film can be introduced with a hydroxyl group (—OH) group using a photoacid generator, thus modifying the surface of the polymer film without damage to the polymer film.

In addition, an organic electronic device including the surface-modified polymer film can be improved in electrical characteristics and stability.

BRIEF DESCRIPTION OF DRAWINGS

FIG. 1 is a flowchart showing a process of manufacturing a surface-modified polymer film according to the present invention;

FIG. 2 is a flowchart showing a process of introducing a hydroxyl group (—OH) using a photoacid generator;

FIG. 3 shows AFM morphologies of Example 1 and Comparative Example 1;

FIG. 4 shows changes in contact angle over time of Example 1;

FIG. 5 shows graphs of the XPS spectra of Example 1 and Comparative Example 2;

FIG. 6 shows a graph of the FT-IR spectra of Example 1 and Comparative Example 2;

FIG. 7 shows gate leakage curves of Example 1 and Comparative Example 2;

FIG. 8A shows the one-dimensional grazing incidence X-ray diffraction (GIXD) pattern of Examples 1 and 2, FIG. 8B shows the OTS molecular structures, and FIG. 8C is a graph showing FT-IR (ATR mode) of Examples 1 and 2;

FIG. 9A shows AFM images of Comparative Examples 3 and 4, and FIG. 9B shows AFM images of Examples 1 and 2, depending on changes in time;

FIG. 10A shows AFM images of Device Examples 1 and 2;

FIG. 10B shows 2D GIXD pattern images, the insertion of FIG. 10B illustrating the 1D-GIXD image;

FIG. 11A shows output curves of Device Examples 1 and 2 and Device Comparative Example 1, and FIG. 11B is a graph showing the transfer characteristics of Device Examples 1 and 2 and Device Comparative Example 1;

FIG. 12 shows the results of comparison and analysis of charge mobility of Device Comparative Examples 2 to 9;

FIG. 13A is a photograph showing the organic transistor of Device Example 3, and FIG. 13B is a graph showing the transfer curve of the organic transistor of Device Example 3; and FIG. 14 shows the configuration of a flexible electronic device according to the present invention.

DESCRIPTION OF SPECIFIC EMBODIMENTS

Hereinafter, embodiments of the present invention are described in detail with reference to the appended drawings so as to be easily performed by a person having ordinary skill in the art.

However, the following description does not limit the present invention to specific embodiments, and moreover, descriptions of known techniques, even if they are pertinent to the present invention, are considered unnecessary and may be omitted insofar as they would make the characteristics of the invention unclear.

The terms herein are used to explain specific embodiments and are not intended to limit the present invention. Unless otherwise stated, the singular expression includes a plural expression. In this application, the terms "include" or "have" are used to designate the presence of features, numbers, steps, operations, elements, or combinations thereof described in the specification, and should be understood as not excluding the presence or additional possibility of one or more different features, numbers, steps, operations, elements, or combinations thereof.

FIG. 1 is a flowchart showing a process of manufacturing a surface-modified polymer film according to the present invention, and FIG. 2 is a flowchart showing a process of introducing a hydroxyl group (—OH) using a photoacid generator. Hereinafter, a detailed description will be given of a method of manufacturing a surface-modified polymer film according to the present invention, with reference to FIGS. 1 and 2, which are merely set forth to illustrate but are not to be construed as limiting the present invention, and the present invention will be defined only by the accompanying claims.

The present invention pertains to a method of manufacturing a surface-modified polymer film, comprising (a) forming a hydroxyl group (—OH) on the surface of a polymer film by subjecting the polymer film to light irradiation and surface treatment with a photoacid generator.

The method of the invention may further include (b) forming a self-assembled monolayer (SAM) on the surface of the polymer film having the hydroxyl group, after step (a).

The method of the invention may further include (a') subjecting the surface of the polymer film to irradiation with UV light and ozone treatment in order to remove dust and impurities from the surface of the polymer: film, before step (a).

The polymer film may be manufactured through any one process of spin coating, dip coating, and spray coating, before step (a).

The polymer film may include at least one selected from among poly(vinyl alcohol), poly(4-vinyl phenol), poly(vinyl chloride), polyisoprene, poly(chloroprene) (PCP), poly(acrylonitrile butadiene), poly(styrene-ethylene-butadiene-styrene), poly(styrene butadiene), polyacrylamide, nylon, poly(vinyl acetate), poly(cis-butadiene), poly(1-vinyl naphthalate), polyethylene terephthalate, polyethylene, polyurethane, poly(hexamethylene adipamide), poly(methyl methacrylate), poly(styrene), poly(dimethylsiloxane), poly(vinylidene fluoride), poly(tert-butylstyrene) polyimide, benzocyclobutene (BCB), poly(acrylonitrile), poly(methylene oxide), poly(cyclohexyl methacrylate), and CYTOP (Cyclized Transparent Optical Polymer).

The photoacid generator may include at least one selected from among triphenylsulfonium triflate (TPS), (4-tert-butylphenyl) diphenylsulfonium triflate, (4-fluorophenyl)diphenylsulfonium triflate, N-hydroxynaphthalimide triflate (NHN), tris(4-tert-butylphenyl) sulfonium triflate, bis(4-tert-butylphenyl)iodonium perfluoro-1-butanesulfonate, and Boc-methoxyphenyldiphenylsulfonium triflate, and preferably triphenylsulfonium triflate (TPS) and N-hydroxynaphthalimide triflate (NHN) are used.

The self-assembled monolayer (SAM) may include at least one selected from among aminopropyltriethoxysilane, hexamethyldisilazane, methyltrichlorosilane, octyltrichlorosilane (OTS), dodecyl trichlorosilane, octadecyltrichlorosilane, trichloro (1H,1H,2H,2H-perfluorooctyl)silane, pentafluorophenyl trichlorosilane, pentafluorophenyl propyl-trichlorosilane, 3-aminoisopropyltriethoxysilane, methoxysilane, chloromethyl (dimethyl)methoxysilane, (3-aminopropyl) trimethoxysilane, dimethyl(3-chloropropyl)methoxysilane, diethoxy (isobutyl) methoxysilane, methoxy(dimethyl)octadecylsilane, octylphosphonic acid, tetradecylphosphonic acid, decylphosphonic acid, octadecylphosphonic acid, 1-dodecanethiol, octanethiol, and caproic acid, and octyltrichlorosilane (OTS) is preferably used.

In step (b), the self-assembly process is performed at −30 to 60° C., preferably −20 to 30° C., and more preferably −10 to 10° C. If the process temperature is lower than −30° C., reactivity may decrease with a decrease in the temperature, which is not preferable from, the viewpoint of processing efficiency. On the other hand, if the process temperature is higher than 60° C., an irregular molecular structure is formed, undesirably deteriorating device performance when applied to a device.

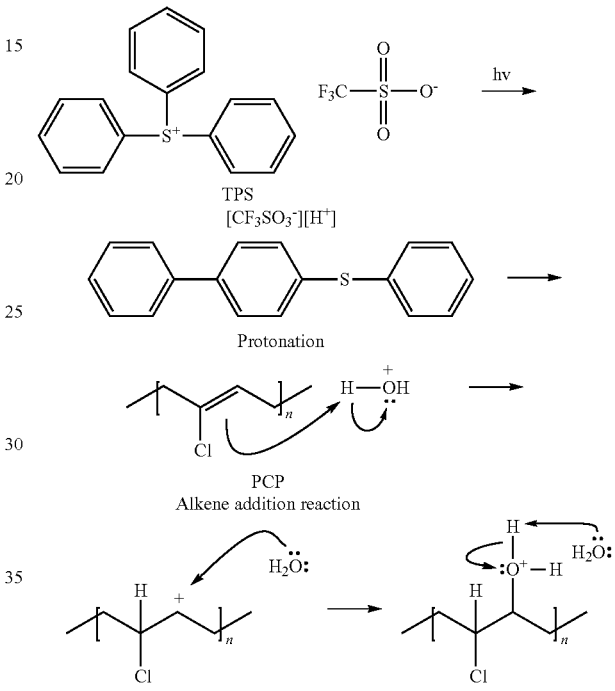

[Scheme 1]

With reference to Scheme 1, the introduction of a hydroxyl group (—OH) to a PCP polymer using a photoacid generator is described. Specifically, TPS (Triphenylsulfonium triflate) and NHN (N-Hydroxynaphthalimide triflate) are dissolved, in a solvent γ-butyrolactone to give a photoacid generator solution, which is then irradiated with UV light and thus protonated. γ-butyrolactone is dissolved in water and is thus completely ionized into $H_3O^+$ (hydronium ion). $H_3O^+$ (hydronium ion), which is a strong acid and an electrophile, is attacked by the π-bond of PCP (Polychloroprene), and thus an alkene addition reaction occurs. Thereby, a stable carbocation is formed, and this intermediate is rapidly attacked by nucleophilic $H_2O$, thus producing an adjunct —OH, This is an acid-catalyzed reaction, whereby the surface of the polymer film having no hydroxyl group (—OH) is modified to be hydrophilic, and self-assembled monolayer molecules are covalently bonded with the hydroxyl group (—OH), and thus the hydrophilic surface may be converted into a hydrophobic surface. This process is a portion of the anticipated reaction, which may involve additional photochemical reaction by UV irradiation in the actual process.

In addition, the present invention pertains to a surface-modified polymer film, manufactured by the above method.

FIG. 14 shows the configuration of a flexible electronic device fabricated according to the present invention. Below is a description of the method of fabricating the flexible electronic device, made with reference to FIG. 14.

In addition, the present invention pertains to a method of fabricating an organic electronic device, comprising: forming a gate insulating layer including a polymer film, on a substrate, and forming an active layer including an organic semiconductor, a source electrode and a drain electrode on the gate insulating layer, in which the forming the gate insulating layer including the polymer film comprises: (a) forming a hydroxyl group (—OH) on the surface of the polymer film by subjecting the polymer film to light irradiation and surface treatment with a photoacid generator, and (b) forming a self-assembled monolayer (SAM) on the surface of the polymer film having the hydroxyl group.

Examples of the organic electronic device may include an organic thin-film transistor, an organic solar cell, and an organic light-emitting diode, and preferably an organic thin-film, transistor is used.

The substrate may be a flexible substrate.

The flexible substrate may include at least one selected from among polyimide, polyethylene naphthalate, parylene, and polyethylene terephthalate.

The organic semiconductor may include at least one selected from among poly(3-hexyl)thiophene, poly(9,9-dioctylfluorene-co-bithiophene), poly[2,5-bis(3-tetradecylthiophen-2-yl)thieno[3,2-b]thiophene], polythiophene, diketopyrrolo-pyrrole-dithiophene-thienothiophene, tetracene, pentacene, fullerene, 6,13-bis (triisopropylsilylethynyl)pentacene (TIPS-pentacene), poly[2,5-bis (3-dodecylthiophen-2-yl) thieno[3,2-b]thiophene] (PBTTT), poly [(4,4-bis(2-ethylhexyl)cyclopenta[2,1-b:3,4-b0]dithiophene)-2,6-diyl-alt-[1,2,5]-thiadiazolo[3,4-c]pyridine] (PCDTPT), didodecyl[1]-benzothieno[3,2-b][1]benzothiophene (C12-BTBT), diketopyrrolopyrrole-dithienylthieno[3,2-b]thiophene (DPP-DTT), cyclopentadithiophene-benzothiadiazole (CDT-BTZ), phthalocyanine, rubrene, 2,7-dioctyl[1]benzothieno[3,2-b][1]benzothiophene, and oligothiophene.

EXAMPLES

A better understanding of the present invention will be given through the following examples, which are merely set forth to illustrate but are not to be construed as limiting the scope of the present invention.

Example 1

Preparation of Surface-Modified PCP Polymer Film Using Photoacid Generator (1) Preparation of Polymer Film A 1.1 wt % poly(chloroprene) (PCP, Aldrlch) solution was dissolved in toluene and added with a 0.1 wt % crosslinking agent (dicumyl peroxide, DCP) and thus sufficiently dissolved. The resulting solution was applied through spin coating to a thickness of 40 nm on a Si substrate and crosslinked at 130° C. in a nitrogen atmosphere in order to prevent an addition reaction from occurring, thereby manufacturing a polymer film.

(2) Preparation of Polymer Film Having Hydroxyl Group Using Photoacid Generator

Thereafter, as photoacid generators, triphenylsulfonium triflate (TPS, Aldrich) and N-hydroxynaphthalimide triflate (NHN, Aldrich, 99%) were dissolved to a concentration of 0.8 wt % in γ-butyrolactone to give a photoacid generator solution on a hot plate at 60° C., and the polymer film was immersed in the photoacid generator solution and exposed to a UV lamp (Spectroline ENF-240C, λ ~254 nm) for at least 3 min to thus carry out a photolytic oxidation reaction. The polymer film subjected to photolytic oxidation was washed with γ-butyrolactone to remove remnants therefrom and baked in an oven at 120° C., thus obtaining a polymer film having a hydroxyl group.

(3) Preparation of Surface-Modified Polymer Film Through Formation of Self-Assembled Monolayer (SAM)

Subsequently, the polymer film having the hydroxyl group was allowed to react in an octadecyltrichlorosilane (OTS)/toluene solution for about 2 hr. In order to maximally increase the uniformity of OTS molecules, a self-assembly process was performed in a nitrogen atmosphere at an optimal temperature of 0° C. After 2 hr, the sample was taken out, and molecules not physically bonded were washed with toluene and ethanol, followed by storage in an oven at 120° C. for 20 min to thus induce chemical covalent bonding. Next, unreacted OTS surface molecules were washed with toluene and ethanol and drying was performed to form an OTS monolayer (self-assembled monolayer, SAM), thereby manufacturing a surface-modified PCP polymer film.

Example 2

Preparation of Surface-Modified PCP Polymer Film Using Photoacid Generator

A surface-modified PCP polymer film was manufactured in the same manner as in Example 1, with the exception that the self-assembly process was performed at 30° C. in a nitrogen atmosphere in step (1), in lieu of the self-assembly process at 0° C. in a nitrogen atmosphere.

Comparative Example 1

Preparation of Surface-Modified PCP Polymer Film Through UV-Ozone Treatment

A surface-modified PCP polymer film was manufactured through UV-ozone treatment in the same manner as in Example 1, with the exception that treatment with UV-ozone (UVO, AH1700, AHTECH) was performed for 10 to 20 min, in lieu of step (2).

Comparative Example 2

Preparation of Surface-Non-Modified PCP Polymer Film

A surface-non-modified PCP polymer film was manufactured in the same manner as in Example 1, with the exception that steps (2) and (3) were not performed.

Comparative Example 3

Preparation of PVA Polymer Film Having Hydroxyl Group (—OH)

A 6 wt % poly (vinyl alcohol) (PVA, Aldrich, Mw ~9 k) solution was dissolved in water and added with a 1 wt % crosslinking agent (ammonium dichromate, ADC) and thus sufficiently dissolved. The resulting solution was applied through spin coating to a thickness of 40 nm on a Si substrate. The coated polymer film was crosslinked using a TJV lamp (Spectroline ENF-240C, λ ~254 nm) for 3 min. The intensity of the UV lamp was 1.2 mW/cm$^2$. In order to remove dust from the polymer film and activate a surface hydroxyl group (—OH), treatment with UV-ozone (UVO, AH1700, AHTECH) was performed for 10 to 20 min. Thereafter, the polymer film treated with UV-ozone was allowed to react in an octadecyltrichlorosilane (OTS)/toluene solution for about 2 hr. In order to maximally increase the uniformity of OTS molecules, a self-assembly process was performed in a nitrogen atmosphere at an optimal temperature of 0° C. After 2 hr, the sample was taken cut, and molecules not physically bonded were washed with toluene and ethanol, followed by storage in an oven at 120° C. for 20 min to thus induce chemical covalent bonding. Next, unreacted OTS surface molecules were washed with toluene and ethanol and drying was performed, thereby manufacturing a PVA polymer film.

Comparative Example 4

Preparation of PVA Polymer Film Having Hydroxyl Group (—OH)

A PVA polymer film was manufactured in the same manner as in Comparative Example 3, with the exception that the self-assembly process was performed at 30° C., in a nitrogen atmosphere, in lieu of the self-assembly process at 0° C. in a nitrogen atmosphere.

Device Example 1

Fabrication of Organic Transistor

The surface-modified PCP polymer film of Example 1 was applied on the washed silicon substrate, after which an organic semiconductor (DNTT) was deposited to a thickness of 40 nm through vacuum thermal evaporation at a rate of 0.1 to 0.2 Ås$^{-1}$, and finally, gold was subjected to vacuum thermal evaporation to form source/drain electrodes, thereby fabricating an organic transistor.

Device Example 2

Fabrication of Organic Transistor

The surface-modified PCP polymer film of Example 2 was applied on the washed silicon substrate, after which an organic semiconductor (DNTT) was deposited to a thickness of 40 nm through vacuum thermal evaporation at a rate of 0.1 to 0.2 Ås$^{-1}$, and finally, gold was subjected to vacuum thermal evaporation to form source/drain electrodes, thereby fabricating an organic transistor.

Device Example 3

Fabrication of Organic Transistor

A flexible substrate, poly (ethylene naphthalate), having a thickness of 100 nm was spin-coated with a polyimide layer as a flattening layer, after which a PEDOT: PSS solution for use in a gate electrode was dissolved at 5 wt % and then applied thereon through spin coating. The surface-modified PCP polymer film of Example 1 was applied on the PEDOT: PSS/polyimide/PEN substrate, after which an organic semiconductor (DNTT) was deposited to a thickness of 40 ran through vacuum thermal evaporation at a rate of 0.1 to 0.2 Ås$^{-1}$, and finally, gold was subjected to vacuum thermal evaporation to form source/drain electrodes, thereby fabricating an organic transistor.

Device Comparative Example 1

Fabrication of Organic Transistor

An organic transistor was fabricated in the same manner as in Device Example 1, with the exception that the surface-non-modified PCP polymer film of Comparative Example 2 was applied in lieu of the surface-modified PCP polymer film of Example 1.

Device Comparative Example 2

Fabrication of Organic Transistor

The surface-modified PVA polymer film of Comparative Example 3 was applied on the washed silicon substrate, after which an organic semiconductor (DNTT) was deposited to a thickness of 40 nm through vacuum thermal evaporation at a rate of 0.1 to 0.2 Ås$^{-1}$, and finally, gold was subjected to vacuum thermal evaporation to form source/drain electrodes, thus manufacturing an organic transistor.

Device Comparative Example 3

Fabrication of Organic Transistor

An organic transistor was fabricated in the same manner as in Device Comparative Example 2, with the exception that the surface-modified PVA polymer film of Comparative Example 4 was applied in lieu of the surface-modified PVA polymer film of Comparative Example 3.

Device Comparative Example 4

Fabrication of Organic Transistor

An organic transistor was fabricated in the same manner as in Device Comparative Example 2, with the exception that an organic semiconductor (fullerene, C60) was deposited in lieu of the organic semiconductor (DNTT).

Device Comparative Example 5

Fabrication of Organic Transistor

An organic transistor was fabricated in the same manner as in Device Comparative Example 4, with the exception that the surface-modified PVA polymer film of Comparative Example 4 was applied in lieu of the surface-modified PVA polymer film of Comparative Example 3.

Device Comparative Example 6

Fabrication of Organic Transistor

An organic transistor was fabricated in the same manner as in Device Comparative Example 2, with the exception that an organic semiconductor (pentacene) was deposited in lieu of the organic semiconductor (DNTT).

Device Comparative Example 7

Fabrication of Organic Transistor

An organic transistor was fabricated in the same manner as in Device Comparative Example 6, with the exception that the surface-modified PVA polymer film of Comparative Example 4 was applied in lieu of the surface-modified PVA polymer film of Comparative Example 3.

Device Comparative Example 8

Fabrication of Organic Transistor

An organic transistor was fabricated in the same manner as in Device Comparative Example 2, with the exception that an organic semiconductor (poly(3-hexylthiophene), P3HT) was deposited in lieu of the organic: semiconductor (DNTT).

Device Comparative Example 9

Fabrication of Organic Transistor

An organic transistor was fabricated in the same manner as in Device Comparative Example 8, with the exception that the surface-modified PVA polymer film of Comparative Example 4 was applied in lieu of the surface-modified PVA polymer film of Comparative Example 3.

The organic transistors of Device Comparative Examples 2 to 9 are shown in Table 1 below.

With reference to FIG. 3, PCP, having a double bond that may break down relatively easily, was easily degraded by UVO energy, and thus the surface roughness of Comparative Example 1 was remarkably increased, and the polymer thin film, having a rough surface, exhibited decreased compatibility with the semiconductor layer when applied to a device. In contrast, the surface of Example 1 was flat.

Test Example 2

Confirmation of Introduction of Hydroxyl Group (—OH)

FIG. 4 shows changes in contact angle over time of Example 1, FIG. 5 is graphs showing the XPS spectra of Example 1 and Comparative Example 2, and FIG. 6 is a graph showing the FT-IR spectra of Example 1 and Comparative Example 2.

With reference to FIG. 4, the contact angle was decreased from 91° to 53° after 15 min, and thus the hydrophobic surface was converted into a hydrophilic surface.

With reference to FIGS. 5 and 6, a C—OH peak and an O—H peak did not appear in Comparative Example 2, but a C—OH peak (~286 eV) and an O—H stretch peak (~3300 $cm^{-1}$) appeared in Example 1.

Thus, the introduction of the hydroxyl group (—OH) to the PCP polymer film using the photoacid generator was confirmed.

TABLE 1

| | Substrate | Gate electrode | Polymer insulating film | Organic semiconductor | Self-assembly temperature | Source/drain electrodes |
|---|---|---|---|---|---|---|
| Device Comparative Example 2 | Silicon | Silicon oxide | PVA | DNTT | 0° C. | Gold |
| Device Comparative Example 3 | | | | DNTT | 30° C. | |
| Device Comparative Example 4 | | | | C60 | 0° C. | |
| Device Comparative Example 5 | | | | C60 | 30° C. | |
| Device Comparative Example 6 | | | | Pentacene | 0° C. | |
| Device Comparative Example 7 | | | | Pentacene | 30° C. | |
| Device Comparative Example 8 | | | | P3HT | 0° C. | |
| Device Comparative Example 9 | | | | P3HT | 30° C. | |

TEST EXAMPLES

Test Example 1

AFM Morphology Comparison

FIG. 3 shows AFM morphologies of Example 1 and Comparative Example 1.

Test Example 3

Confirmation of Electrical Barrier Properties of Polymer Thin Film

FIG. 7 shows the gate leakage curves of Example 1 and Comparative Example 2.

With reference to FIG. 7, the curve of Example 1 was similar to the curve of Comparative Example 2, which means that the electrical barrier properties (insulating properties) of the surface-modified PCP polymer film using the photoacid generator of Example 1 were efficiently maintained.

Test Example 4

Changes in Structure of OTS Molecule Depending on Self-Assembly Temperature

FIG. 8A shows the one-dimensional grazing incidence X-ray diffraction (GIXD) pattern of Examples 1 and 2, FIG. 8B shows the OTS molecular structures, and FIG. 8C is a graph showing the FT-IR (ATR mode) of Examples 1 and 2. FIG. 9A shows AFM images depending on changes in the immersion time of Comparative Examples 3 and 4, and FIG. 9B shows AFM images depending on changes in the immersion time of Examples 1 and 2, the white scale bar showing 250 nm.

With reference to FIGS. 9A and 9B, the final morphologies of Examples 1 and 2 and Comparative Examples 3 and 4 were similar, and the surface morphology over time varied depending on the temperature (0° C. and 30° C.).

With reference to FIGS. 8A to 8C, the FT-IR (ATR mode) spectra of Examples 1 and 2 show 2850 cm$^{-1}$ and 2917 cm$^{-1}$ bands, corresponding to the symmetrical and asymmetrical —CH$_2$— methylene stretching modes. The peaks of the OTS monolayer (SAM) of Example 1 were exactly positioned at 2850 cm$^{-1}$ and 2917 cm$^{-1}$, which indicates the regular alkyl chain structure of the OTS monolayer (SAM). On the other hand, the peaks of the OTS monolayer (SAM) grown at 30° C. were shifted upwards to high wavenumbers of 2854 cm$^{-1}$ and 2923 cm$^{-1}$. This means that the regular alkyl chain structure is converted into a disordered structure. Furthermore, as shown in the GIXD pattern, the OTS monolayer (SAM) of Example 1 showed a peak at $q_{xy}$=1.48 Å$^{-1}$, corresponding to crystalline properties, unlike the OTS monolayer (SAM) of Example 2.

Accordingly, it can be confirmed that the OTS monolayers (SAMs) had the same morphology properties depending on the self-assembly temperature but had different physical states, and also that the OTS monolayer (SAM) formed through self-assembly at 0° C. had a chain having high crystallinity. As a result, Example 1 and Comparative Example 3, having an OTS monolayer (SAM) formed through self-assembly at 0° C., had a hard and regular molecular structure compared to Example 2 and Comparative Example 4, having an OTS monolayer (SAM) formed through self-assembly at 30° C.

Test Example 5

Analysis of Difference in Organic Transistor Performance Depending on Temperature FIG. 10A shows AFM images of Device Examples 1 and 2, and FIG. 10B shows 2D GIXD pattern images. The insertion of FIG. 10B shows the 1D-GIXD image, blue: Device Example 2, red: Device Example 1. FIG. 11A shows the output curves of Device Examples 1 and 2 and Device Comparative Example 1, and FIG. 11B is a graph showing the transfer characteristics of Device Examples 1 and 2 and Device Comparative Example 1 (black: Device Comparative Example 1, blue: Device Example 2, red: Device Example 1).

As shown in FIGS. 10A and 10B, the organic semiconductor (right) of the organic transistor including the OTS monolayer (SAM) formed through self-assembly at 0° C. of Device Example 1 can be confirmed to have a large crystal size compared to the organic semiconductor (left) of the organic transistor including the OTS monolayer (SAM) formed through self-assembly at 30° C. of Device Example 2, and based on the results of the 2D GIXD pattern, the organic transistor (right) including the OTS monolayer (SAM) formed through self-assembly at 0° C. of Device Example 1 can be found to exhibit high crystal Unity in both, vertical and parallel orientations.

As shown in FIGS. 11A and 11B, the charge mobility was 1.5 cm$^2$/Vs in Device Example 1, 0.5 cm$^2$/Vs in Device Example 2, and 0.3 cm$^2$/Vs in Device Comparative Example 1, and thus the charge mobility of Device Example 1 was five times as high as that of Device Comparative Example 1.

Therefore, the self-assembly temperature for forming the OTS monolayer (SAM) can be concluded to have an influence on the growth of the organic semiconductor and the electrical characteristics of the organic transistor.

Test Example 6

Performance of Organic Transistor Device Depending on the Kind of Organic Semiconductor FIG. 12 shows the results of comparison and analysis of charge mobility of Device Comparative Examples 2 to 9.

With reference to FIG. 12, the charge carrier mobility of Device Comparative Examples 2, 4, 6 and 8, having the OTS monolayer (SAM) formed through self-assembly at 0° C., was two or three times as high as that of Device Comparative Examples 3, 5, 7 and 9, having the OTS monolayer (SAM) formed through self-assembly at 30° C.

Thus, the use of various organic semiconductors was possible, and when the self-assembly temperature was 0° C., the electrical performance of the organic transistor: was superior.

Test Example 7

Performance of Organic Transistor Device

FIG. 13A is a photograph showing the organic transistor of Device Example 3, and FIG. 13B is a graph showing the transfer curve of the organic transistor of Device Example 3.

With reference to FIGS. 13A and 13B, stable electrical characteristics were exhibited, and the performance of the organic transistor including the surface-modified polymer film using the photoacid generator was superior.

The scope of the invention is represented by the claims below rather than the aforementioned detailed description, and all of the changes or modified forms that are capable of being derived from the meaning, range, and equivalent concepts of the appended claims should be construed as being included in the scope of the present invention.

What is claimed is:

1. A method of manufacturing a surface-modified polymer film, comprising:
(a) forming a hydroxyl group (—OH) on a surface of a polymer film by subjecting a solution comprising the polymer film and a photoacid generator to light irradiation;
wherein the photoacid generator includes at least one selected from among triphenylsulfonium triflate (TPS), (4-tert-butylphenyl) diphenylsulfonium triflate, (4-fluorophenyl)diphenylsulfonium triflate, N-hydroxynaphthalimide triflate (NHN), tris(4-tertbutylphenyl)sulfonium triflate, bis(4-tert-butylphenyl) iodonium perfluoro-1-butanesulfonate, and Boc-methoxyphenyldiphenylsulfonium triflate.

2. The method of claim 1, further comprising (b) forming a self-assembled monolayer (SAM) on the surface of the polymer film having the hydroxyl group, after step (a).

3. The method of claim 2, wherein the self-assembled monolayer (SAM) includes at least one selected from among aminopropyltriethoxysilane, hexamethyldisilazane, methyltrichlorosilane, octyltrichlorosilane (OTS), dodecyl trichlorosilane, octadecyltrichlorosilane, trichloro(1H,1H,2H,2H-perfluorooctyl)silane, pentafluorophenyl trichlorosilane, pentafluorophenyl propyl-trichlorosilane, 3-aminoisopropyltriethoxysilane, methoxysilane, chloromethyl (dimethyl) methoxysilane, (3-aminopropyl)trimethoxysilane, dimethyl (3-chloropropyl)methoxysilane, diethoxy(isobutyl)methoxysilane, methoxy(dimethyl)octadecylsilane, octylphosphonic acid, tetradecylphosphonic acid, decylphosphonic acid, octadecylphosphonic acid, 1-dodecanethiol, octanethiol, and caproic acid.

4. The method of claim 2, wherein step (b) is performed at −30 to 60° C.

5. The method of claim 4, wherein step (b) is performed at −20 to 30° C.

6. The method of claim 5, wherein step (b) is performed at −10 to 10° C.

7. The method of claim 1, further comprising (a') subjecting the surface of the polymer film to irradiation with UV light and ozone treatment, before step (a).

8. The method of claim 1, wherein the polymer film is manufactured through any one process of spin coating, dip coating, and spray coating, before step (a).

9. The method of claim 1, wherein the polymer film includes at least one selected from among poly(vinyl alcohol), poly(4-vinyl phenol), poly(vinyl chloride), polyisoprene, poly(chloroprene) (PCP), poly(acrylonitrile butadiene), poly(styrene-ethylene-butadiene-styrene), poly(styrene butadiene), polyacrylamide, nylon, poly(vinyl acetate), poly(cis-butadiene), poly(1-vinyl naphthalate), polyethylene terephthalate, polyethylene, polyurethane, poly(hexamethylene adipamide), poly(methyl methacrylate), poly(styrene), poly(dimethylsiloxane), poly(vinylidene fluoride), poly(tert-butylstyrene) polyimide, benzocyclobutene (BCB), poly(acrylonitrile), poly(methylene oxide), poly(cyclohexyl methacrylate), and CYTOP (Cyclized Transparent Optical Polymer).

10. A method of fabricating an organic electronic device, comprising:
   forming a gate insulating layer including a polymer film on a substrate; and
   forming an active layer including an organic semiconductor, a source electrode and a drain electrode on the gate insulating layer,
   wherein the forming the gate insulating layer including the polymer film comprises:
   (a) forming a hydroxyl group (—OH) on a surface of the polymer film by subjecting a solution comprising the polymer film and a photoacid generator to light irradiation; and
   (b) forming a self-assembled monolayer (SAM) on the surface of the polymer film having the hydroxyl group;
   wherein the photoacid generator includes at least one selected from among triphenylsulfonium triflate (TPS), (4-tert-butylphenyl) diphenylsulfonium triflate, (4-fluorophenyl)diphenylsulfonium triflate, N-hydroxynaphthalimide triflate (NHN), tris(4-tert-butylphenyl)sulfonium triflate, bis(4-tert-butylphenyl) iodonium perfluoro-1-butanesulfonate, and Boc-methoxyphenyldiphenylsulfonium triflate.

11. The method of claim 10, wherein the organic electronic device is any one selected from among an organic thin-film transistor, an organic solar cell, and an organic light-emitting diode.

12. The method of claim 11, wherein the organic electronic device is an organic thin-film transistor.

13. The method of claim 10, wherein the substrate is a flexible substrate.

14. The method of claim 13, wherein the flexible substrate includes at least one selected from among polyimide, polyethylene naphthalate, Parylene, and polyethylene terephthalate.

15. The method of claim 10, wherein the organic semiconductor includes at least one selected from among poly (3-hexyl)thiophene, poly(9,9-dioctylfluorene-co-bithiophene), poly[2,5-bis(3-tetradecylthiophen-2-yl)thieno[3,2-b]thiophene], polythiophene, diketopyrrolo-pyrroledithiophene-thienothiophene, tetracene, pentacene, fullerene, 6,13-bis(triisopropylsilylethynyl)pentacene (TIPS-pentacene), poly[2,5-bis(3-dodecylthiophen-2-yl)thieno[3,2-b]thiophene] (PBTTT), poly[(4,4-bis(2-ethylhexyl)cyclopenta[2,1-b:3,4-b0]dithiophene)-2,6-diyl-alt-[1,2,5]-thiadiazolo[3,4-c]pyridine] (PCDTPT), didodecyl[1]benzothieno[3,2-b] [1] benzothiophene(C12-BTBT), diketopyrrolopyrrole-dithienylthieno[3,2-b]thiophene (DPP-DTT), cyclopentadithiophene-benzothiadiazole (CDT-BTZ), phthalocyanine, rubrene, 2,7-dioctyl[1]benzothieno[3,2-b][1]benzothiophene, and oligothiophene.

* * * * *